(12) United States Patent
Jang et al.

(10) Patent No.: US 6,707,085 B2
(45) Date of Patent: Mar. 16, 2004

(54) MAGNETIC RANDOM ACCESS MEMORY

(75) Inventors: In Woo Jang, Seoul (KR); Young Jin Park, Kyoungki-do (KR); Kye Nam Lee, Kyoungki-do (KR); Chang Shuk Kim, Kyoungki-do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/331,286

(22) Filed: Dec. 30, 2002

(65) Prior Publication Data

US 2003/0218197 A1 Nov. 27, 2003

(30) Foreign Application Priority Data

May 24, 2002 (KR) ................ 10-2002-0028994

(51) Int. Cl.[7] ............................................ H01L 31/119
(52) U.S. Cl. ...................... 257/295; 257/296; 257/300
(58) Field of Search ................................. 257/295, 296, 257/300, 421, 9, 259, 3; 365/158

(56) References Cited

U.S. PATENT DOCUMENTS 6,445,612 B1 * 9/2002 Naji ........................... 365/158
6,518,588 B1 * 2/2003 Parkin et al. .................. 257/3

\* cited by examiner

*Primary Examiner*—David Nelms
*Assistant Examiner*—Thinh T Nguyen
(74) *Attorney, Agent, or Firm*—Marshall, Gerstein & Borun LLP

(57) ABSTRACT

A magnetic random access memory (MRAM) is disclosed, which achieves high integration by forming second word lines that serve as two write lines for one pair of MRAMs. A contact plug is formed by connecting the second word line to a metal wire formed above the bit lines. As a result, the bit lines and the contact plug are used to drive the device, thereby achieving high integration of the device.

6 Claims, 6 Drawing Sheets

MAGNETIC RANDOM ACCESS MEMORY

BACKGROUND

1. Technical Field

A magnetic random access memory (abbreviated as 'MRAM') is disclosed. More specifically, an improved MRAM having a higher speed than an SRAM, integration density as high as a DRAM, and the properties of a non-volatile memory such as a flash memory, is disclosed

2. Description of the Related Art

Most of the semiconductor memory manufacturing companies have developed the MRAM which uses a ferromagnetic material as one of the next generation memory devices.

The MRAM is a memory device for reading and writing information by forming multi-layer ferromagnetic thin films, and sensing current variations according to a magnetization direction of the respective thin films. The MRAM has high speed, low power consumption and high integration density due to the special properties of the magnetic thin film, and performs a nonvolatile memory operation such as a flash memory.

In its function as a memory device, the MRAM utilizes a giant magneto resistive (GMR) or spin-polarized magneto-transmission (SPMT) phenomenon, which is generated when the spin influences electron transmission.

The MRAMs using GMR phenomenon utilize a phenomenon in which resistance is remarkably varied when spin directions are different in two magnetic layers having a non-magnetic layer disposed between the two magnetic layers.

The MRAMs using SPMT utilize a phenomenon in which larger current transmission is generated when spin directions are identical in two magnetic layers having an insulating layer disposed therebetween.

MRAM research, however, is still in its early stages, and is concentrated mostly on the formation of multi-layer magnetic thin films and less on the research of unit cell structure and peripheral sensing circuits.

FIGS. 1a and 1b are a cross-sectional view and a layout view, respectively, of a conventional MRAM. One bit line and one word line are formed in pairs for each magnetic tunnel junction (MTJ) cell, which makes it difficult to obtain spacing between metal wires. Here, FIG. 1a is a cross-sectional view taken along line A—A of FIG. 1b.

Referring to FIG. 1a, the conventional MRAM includes first word lines 13, which are a pair of gates formed on a semiconductor substrate 11. A first impurity junction region 15-1 and a pair of second impurity junction regions 15-2 are also formed on the semiconductor substrate 11. The first impurity junction region 15-1 is disposed between the pair of first word lines 13, and the second impurity junction regions 15-2 are disposed on both sides of the first impurity junction region 15-1 so that the pair of first word lines 13 lies on the semiconductor substrate 11 between the first impurity junction region 15-1 and the second impurity junction regions 15-2. A ground line 23 is connected to the first impurity junction region 15-1 through a contact plug 19. A pair of connection layers 27 is connected to the pair of second impurity junction regions 15-2 through a stacked structure of a first contact plug 17, a conductive layer 21, and a second contact plug 24. Second word lines 25 are formed above the first word lines 13 and disposed below the connection layers 27. The pair of MTJ cells 29 is formed on the connection layers 27 that are disposed above the second word line 25, and has a width as large as that of the second word lines 25. Bit lines 33 are connected to the MTJ cells 29 through third contact plugs 31 that are vertical to the first and the second word lines 13 and 25. The ground line 23 is formed at the center portion, and the first word lines 13, the connection layers 27, the second word lines 25, and the MTJ cells 29 are symmetrically formed with respect to the ground line 23.

Referring to FIG. 1b, in area of one MRAM cell is 2F×6F, i.e., 12F2, where 'F' is the minimum size of a line/space width that can be formed according to a lithography process.

As described above, the conventional MRAM has one bit line and word lines formed in pairs for each MTJ cell 29. This makes it difficult to obtain sufficient spacing for metal wires in order to achieve a high integration density of the device due to increased cell size.

SUMMARY

A magnetic random access memory (MRAM) is disclosed, which achieves high integration by forming a second word line that serves as two write lines of MRAMs arranged vertically so that one line can apply a magnetic field to two MTJ cells.

There is provided an MRAM including a pair of first word lines formed on a semiconductor substrate; a first impurity junction region and a pair of second impurity junction regions formed on the semiconductor substrate, the first impurity junction region disposed between the pair of first word lines and the pair of second impurity junction regions disposed on both sides of the first impurity junction region so that the pair of first word lines lies on the semiconductor substrate between the first impurity junction region and the pair of second impurity junction regions; a ground line connected to the first impurity junction region; a pair of connection layers respectively connected to the pair of second impurity junction regions; a pair of MTJ cells respectively connected to the pair of connection layers; a pair of bit lines respectively connected to the pair of MTJ cells; a second word line, which is a write line, formed above the ground line to be electrically isolated from the ground line; and a metal wire connected to the second word line, the metal wire running in the perpendicular direction to the pair of bit lines, and wherein each bit line has a thickness ranging from 4000 to 5000 Å. The distance between the MTJ cell and the metal wire ranges from 10000 to 50000 Å. The distance between the bit line and the metal wire ranges from 1000 to 3000 Å. The second word line is used as an outbound current path, the metal wire and second word line is connected by a metal wire contact plug, and the distance between the MTJ cell and the metal wire contact plug ranges from 0.5 F to 1.9 P.

BRIEF DESCRIPTION OF THE DRAWINGS

The disclosed devices will become better understood with reference to the accompanying drawings which are given only by way of illustration and thus are not limitative of this disclosure. In the drawings.

DETAILED DESCRIPTION

A magnetic random access memory (MRAM) in accordance with a preferred embodiment will now be described in detail with reference to the accompanying drawings.

Figure 1A:
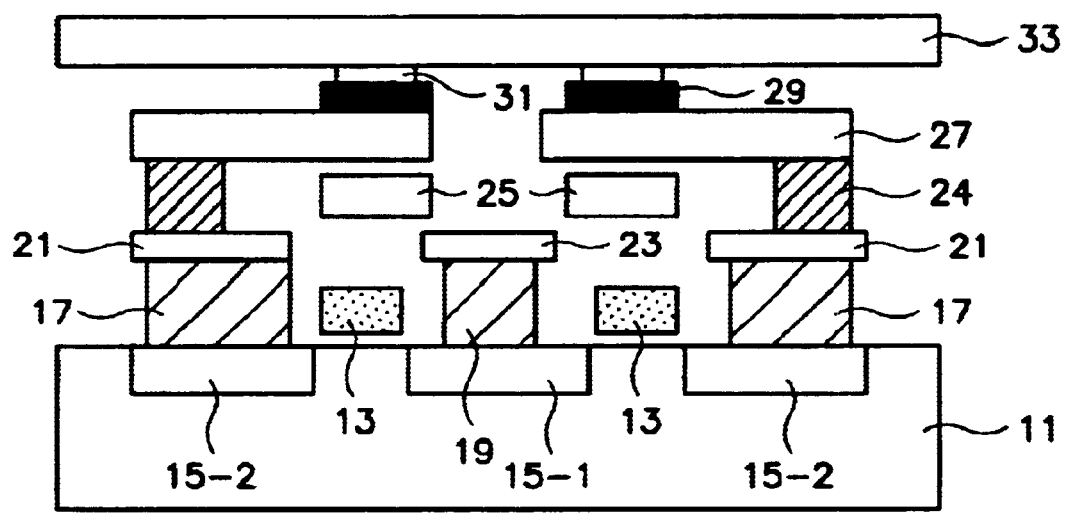
FIGS. 1a and 1b are a cross-sectional view and a layout view, respectively, illustrating a conventional MRAM.
Figure 1B:
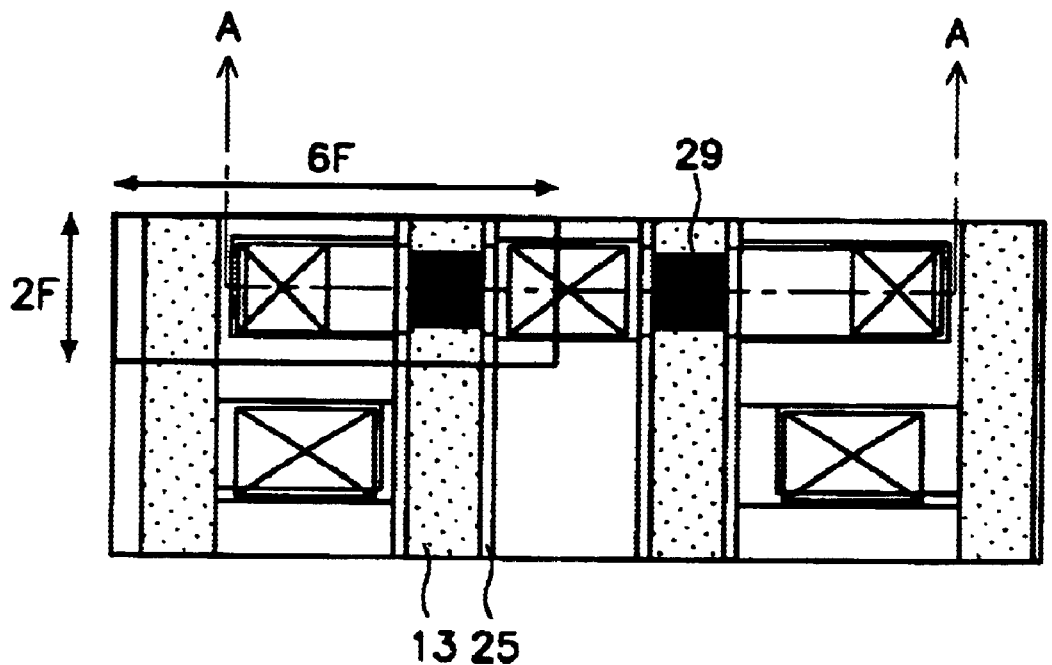
Figure 2:
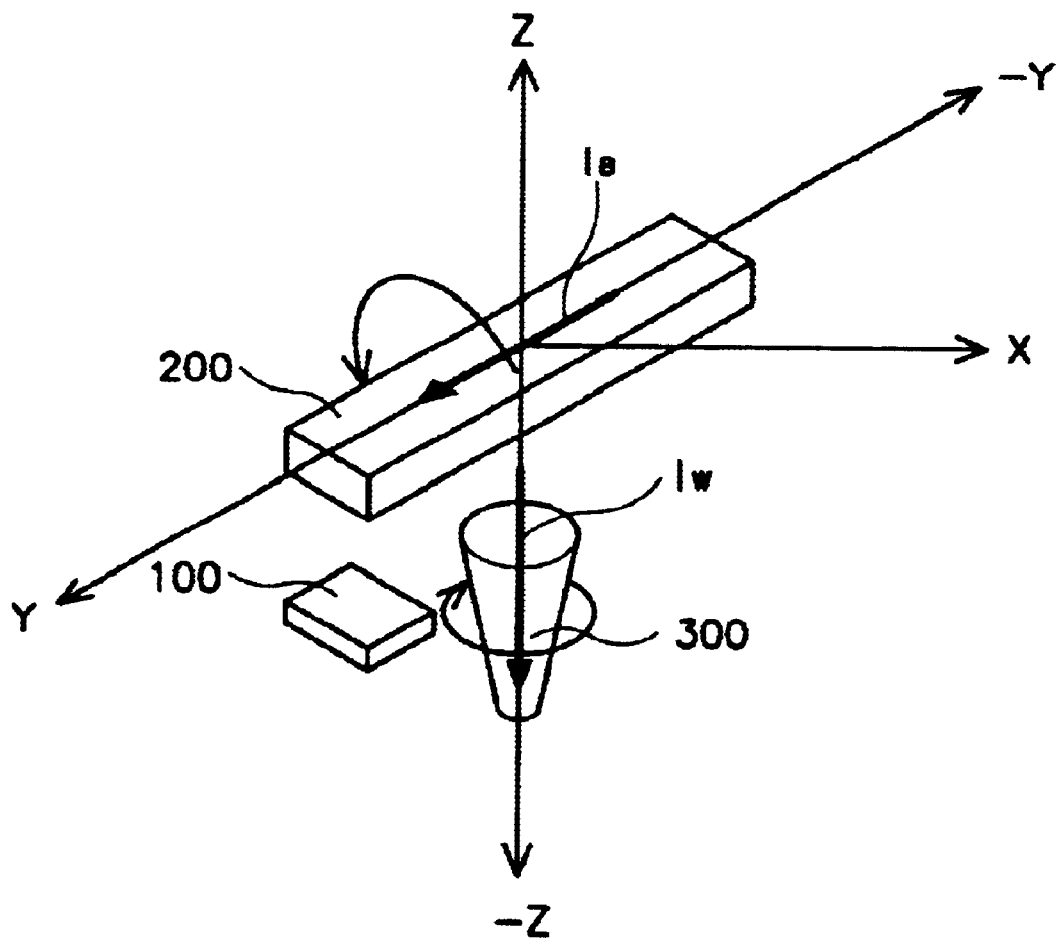
FIG. 2 is a perspective view of an MRAM in accordance with a preferred embodiment.

As illustrated in FIG. 2, a bit line 200 is formed over a MTJ cell 100, the bit line 200 having substantially the same line width as the MTJ cell 100. A current flows in the direction of the Y axis. A metal wire contact plug 300 connected to a metal wire (not shown) located below the bit line 200 and vertical with respect to the bit line 200 is disposed toward the direction of the −Z axis. Here, the metal wire contact plug 300 is disposed between the pair of MTJ cells 100 so that the current can flow from the metal wire (not shown) to the contact plug 300. Therefore, a magnetization direction of the MTJ cell 100 is determined by using the Y axis direction current of the bit line 200 and the −Z axis direction current of the metal wire contact plug 300. Accordingly, the structure of second word lines, which are write lines, is simplified to achieve high integration of a semiconductor device.

Figure 3A:
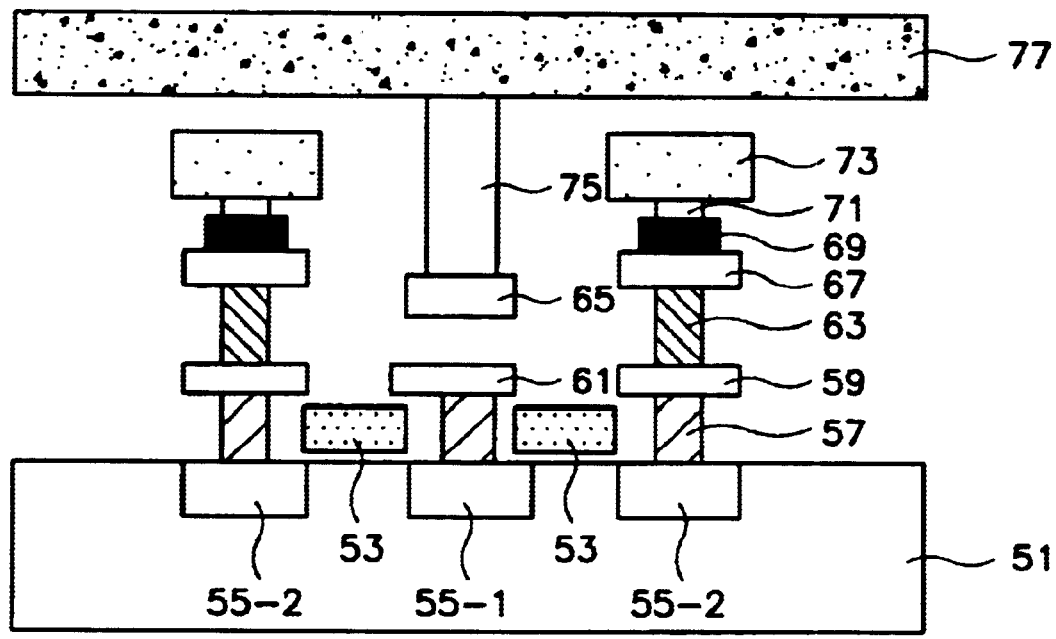
FIGS. 3a and 3b are a cross-sectional view and a layout view, respectively, illustrating the MRAM in accordance with the preferred embodiment.
Figure 3B:
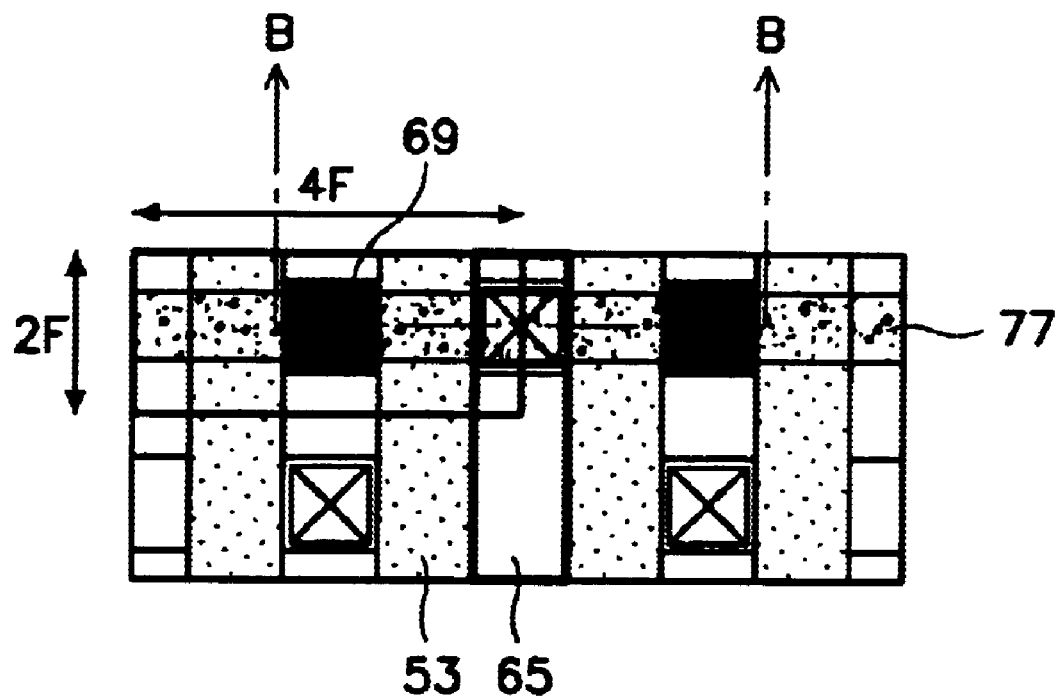

FIGS. 3a and 3b are a cross-sectional view and a layout view, respectively, illustrating the MRAM in accordance with the preferred embodiment. Here, FIG. 3a is a cross-sectional view taken along line B—B of FIG. 3b.

Referring to FIG. 3a, the MRAM includes first word lines 53, which are a pair of gates formed on a semiconductor substrate 51, a first impurity junction region 55-1, and a pair of second impurity junction regions 55-2 formed on the semiconductor substrate 51. The first impurity junction region 55-1 is disposed between the first word lines 53, and the pair of second impurity junction regions 55-2 is disposed on both sides of the first impurity region 55-1 so that each one of the pair of first word lines 53 lies on the semiconductor substrate 51 between the first impurity junction region 55-1 and one of the second impurity junction regions 55-2. A ground line 61 is connected to the first impurity junction region 55-1 through a contact plug 19. A pair of connection layers 67 is connected to the pair of second impurity junction regions 55-2 through a stacked structure of a first contact plug 63, a conductive layer 59, and a second contact plug 57. A pair of MTJ cells 69 is formed on the connection layers 67. A pair of bit lines 73 is connected to the pair of MTJ cells 69 through third contact plugs 71. A metal wire contact plug 75 is disposed above the ground line 61 and between the pair of MTJ cells 69. A second word line 65 is connected to a lower portion of the metal wire contact plug 75 and disposed above the ground line 61. In addition, the second word line 65 is disposed below the pair of second connection layers 67. A metal wire 77 is connected to an upper portion of the metal wire contact plug 75 and disposed above and vertical to the pair of bit lines 73.

Preferably, the bit line 73 has a thickness ranging from 4000 to 5000 Å. In addition, the distance between the bit line 73 and the metal wire 77 ranges from 1000 to 3000 Å, and the distance between the MTJ cell 69 and the metal wire 77 ranges from 10000 to 50000 Å.

Preferably, the distance between the MTJ cell 69 and the metal wire contact plug 75 ranges from 0.5 F to 1.9 F.

Now referring to FIG. 3b, if the distance between the MTJ cell 69 and metal wires is 1F, and the pair of MRAMs includes only one write line, the area for forming the MRAM is reduced to 2F×4F, i.e., 8F2.

Figure 4:
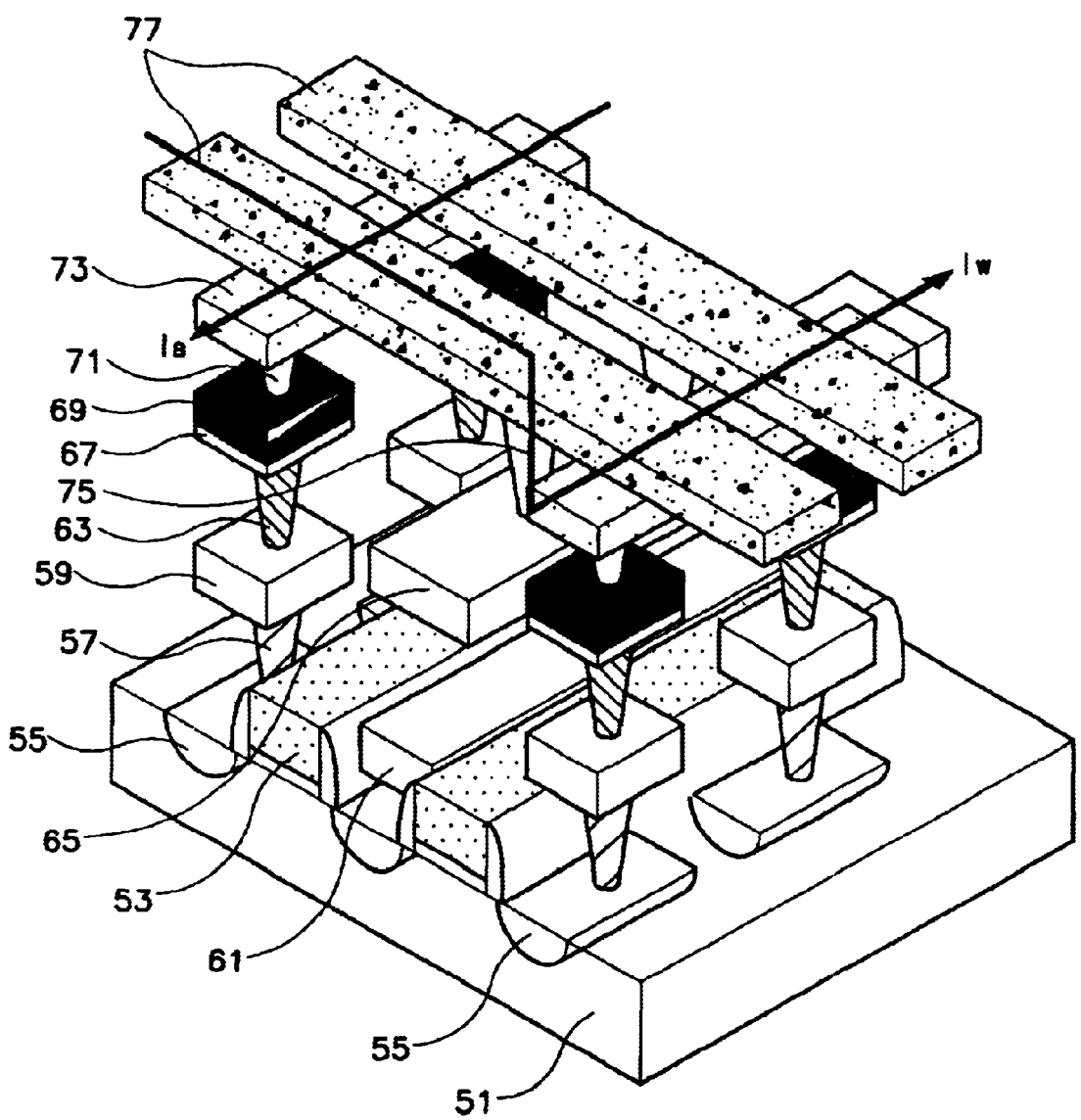
FIG. 4 is a perspective view illustrating the MRAM in accordance with the preferred embodiment.

FIG. 4 is a perspective view illustrating the MRAM in accordance with the preferred embodiment.

The operation of reading information from the MTJ cell 69 is as follows. A voltage is applied to the first word lines 53, which are read lines, to turn on a field effect transistor. The magnitude of the current flowing through the bit lines 73 is sensed to detect a magnetization direction of a free ferromagnetic layer (not shown) of the MTJ cell 69.

The operation of storing information in the MTJ cell 69 is as follows. A voltage is applied to the metal wire 77 in which a current flows through the metal wire 77, the metal wire contact plug 75, and the second word line 65. While maintaining the field effect transistor in an off state, the magnetization direction in the free ferromagnetic layer (not shown) in the MTJ cell 69 is controlled by a magnetic field generated by the current IW flowing through the metal wire contact plug 75 and a magnetic field generated by the current IB generated by the voltage applied to the bit lines 73. Here, the second word line 65 serves as an outbound current path.

The MTJ cell is a resistance variation device composing the MRAM such as a transistor, and can be formed from various magneto resistive devices whose resistance values are varied by magnetization or magnetism, such as AMR, GMR, spin valve, ferromagnetic substance/metal-semiconductor hybrid structure, III–V group magnetic semiconductor composite structure, metal (semi-metal/semiconductor composite structure, and clossal magneto-resistance (CMR), and phase transformation devices whose resistance values are varied according to material phase transformation by an electric signal.

The upper structure of the second word line, which is a write line, is formed, regardless of the lower structure of the above-described embodiment.

As discussed earlier, the word line is formed to invert the magnetization direction of the magnetic material, and the second word line is formed vertical to the word line. As a result, one second word line is formed as the write line for a pair of MRAMs, thereby achieving high integration of the device.

As the disclosed devices may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A magnetic random access memory comprising:
   a pair of first word lines formed on a semiconductor substrate;
   a first impurity junction region and a pair of second impurity junction regions formed on the semiconductor substrate, the first impurity junction region disposed between the pair of first word lines and the pair of second impurity junction regions disposed on both sides of the first impurity junction region so that the pair of first word lines lies on the semiconductor substrate between the first impurity junction region and the pair of second impurity junction regions;
   a ground line connected to the first impurity junction region;
   a pair of connection layers respectively connected to the pair of second impurity junction regions;
   a pair of MTJ cells respectively connected to the pair of connection layers;
   a pair of bit lines respectively connected to the pair of MTJ cells;

a second word line, which is a write line, formed above the ground line to be electrically isolated from the ground line; and a metal wire connected to the second word line, the metal wire running in the perpendicular direction to the pair of bit lines.

2. The magnetic random access memory according to claim 1, wherein the bit line has a thickness ranging from 4,000 to 5,000 Å.

3. The magnetic random access memory according to claim 1, wherein a distance between the MTJ cell and the metal wire ranges from 10,000 to 50,000 Å.

4. The magnetic random access memory according to claim 1, wherein a distance between the bit line and the metal wire ranges from 1,000 to 3,000 Å.

5. The magnetic random access memory according to claim 1, wherein the second word line is used as a current path.

6. The magnetic random access memory according to claim 1, wherein the metal wire and second word line is connected by a metal wire contact plug and the distance between the MTJ cell and the metal wire contact plug ranges from 0.5 F to 1.9 F.

* * * * *